(12) United States Patent
Li

(10) Patent No.: US 10,411,138 B2
(45) Date of Patent: Sep. 10, 2019

(54) FLASH MEMORY STRUCTURE, MEMORY ARRAY AND FABRICATION METHOD THEREOF

(71) Applicant: Shanghai Huahong Grace Semiconductor Manufacturing Corporation, Shanghai (CN)

(72) Inventor: Binghan Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 9 days.

(21) Appl. No.: 15/783,721

(22) Filed: Oct. 13, 2017

(65) Prior Publication Data
US 2018/0301562 A1 Oct. 18, 2018

(30) Foreign Application Priority Data
Apr. 14, 2017 (CN) .......................... 2017 1 0241903

(51) Int. Cl.
| | |
|---|---|
| H01L 29/788 | (2006.01) |
| H01L 29/78 | (2006.01) |
| H01L 27/11521 | (2017.01) |
| H01L 21/266 | (2006.01) |
| H01L 29/66 | (2006.01) |
| H01L 21/28 | (2006.01) |
| H01L 29/423 | (2006.01) |

(52) U.S. Cl.
CPC ........ *H01L 29/7883* (2013.01); *H01L 21/266* (2013.01); *H01L 21/28273* (2013.01); *H01L 27/11521* (2013.01); *H01L 29/42328* (2013.01); *H01L 29/66825* (2013.01); *H01L 29/7831* (2013.01)

(58) Field of Classification Search
USPC ......................................................... 257/322
See application file for complete search history.

(56) References Cited

U.S. PATENT DOCUMENTS

| | | | | |
|---|---|---|---|---|
| 6,475,857 B1* | 11/2002 | Kim | ...................... | H01L 27/105 257/E21.682 |
| 2004/0132251 A1* | 7/2004 | Yoshino | ................ | H01L 21/265 438/267 |
| 2008/0123416 A1* | 5/2008 | Chih | ................... | G11C 16/0433 365/185.05 |
| 2010/0290292 A1* | 11/2010 | Tanizaki | ................ | G11C 16/10 365/185.22 |

(Continued)

*Primary Examiner* — Zandra V Smith
*Assistant Examiner* — Lawrence C Tynes, Jr.
(74) *Attorney, Agent, or Firm* — Murtha Cullina LLP

(57) ABSTRACT

A flash memory structure, a memory array and a fabrication method thereof are disclosed. In the flash memory structure, an erase gate structure is formed between two floating gates, and a word line structure is formed on an outer side of each of the two floating gates, with an oxide layer formed between the word line structure and the substrate. The flash memory structure can be fabricated with a simple process. The memory array employing the flash memory structure is capable of erase operations by means of a voltage applied on erase gate lines and of read operations by means of a voltage applied on word lines. This enables read operations at a lower voltage with less power consumed by the memory array. In addition, the memory array is more efficient and more durable.

6 Claims, 7 Drawing Sheets

(56) References Cited

U.S. PATENT DOCUMENTS

| | | | |
|---|---|---|---|
| 2012/0087188 A1* | 4/2012 | Hsieh | G11C 16/08 365/185.05 |
| 2015/0137207 A1* | 5/2015 | Chuang | H01L 29/49 257/316 |
| 2016/0233224 A1* | 8/2016 | Rhie | H01L 27/11582 |
| 2017/0194336 A1* | 7/2017 | Lin | H01L 27/11521 |

* cited by examiner

|  | VEG | VSL | VBL/IBL | VWL |
|---|---|---|---|---|
| Erase | 12V | 0 | VBL=0 | 0 |
| Program | 8V | 8V | IBL=Idp | 1V |
| Read | 0 | 0 | VBL=0.8V | <1.5V |

FLASH MEMORY STRUCTURE, MEMORY ARRAY AND FABRICATION METHOD THEREOF

CROSS-REFERENCES TO RELATED APPLICATIONS

This application claims the priority of Chinese patent application number 201710241903.2, filed on Apr. 14, 2017, the entire contents of which are incorporated herein by reference.

TECHNICAL FIELD

The present invention relates to the field of semiconductor storage technology and, in particular, to a flash memory structure, a memory array and a fabrication method thereof.

BACKGROUND

In recent years, in the field of semiconductor storage, the development of flash memories is particularly fast. Flash memories primarily feature the ability to keep the stored information for a long time without power and have the advantages such as high integration, fast access and the ability to be easily erased and read. Therefore, they are widely used in microcomputers, automation control and many other applications.

A flash memory is typically a memory array consisting of a number of memory cells (flash memory structures) each connected (by its gate) to a word line that is capable of both erase operations requiring a high voltage (e.g., 12 V) and read operations requiring a low voltage (e.g., 2.5 V). In order to allow these erase and read operations, a dielectric layer (coupling oxide layer) between the word line and the substrate is conventionally made relatively thick to impart a high turn-on voltage.

Thus, such conventional flash memories are associated with the issues of high power consumption, inferior durability and low operating efficiency, which make them unsuitable to be used in some applications in which low power consumption, high operating efficiency and durability are required.

Therefore, there is a need for a flash memory structure, a memory array and a fabrication method thereof which can solve the above problems.

SUMMARY OF THE INVENTION

It is an objective of the present invention to propose a novel flash memory structure and a memory array, which are less power-consuming, readable at a lower voltage, operable with higher efficiency and more durable, as well as a fabrication method thereof.

To this end, the proposed flash memory structure includes: a substrate having a source and a drain formed therein; a floating gate structure including two floating gates formed on the substrate; an erase gate structure formed on the substrate and between the two floating gates; a word line structure formed on an outer side of each of the two floating gates; and an oxide layer formed between the word line structure and the substrate.

Optionally, in the flash memory structure, the oxide layer may have a thickness of from 10 Å to 40 Å.

Optionally, in the flash memory structure, the thickness of the oxide layer may be 18 Å, 25 Å or 28 Å.

Optionally, in the flash memory structure, the word line structures and the floating gate structure may be both formed on a portion of the substrate between the source and the drain.

Optionally, the flash memory structure may further include a spacer formed between the word line structure and a corresponding one of the two floating gates.

Optionally, in the flash memory structure, the erase gate structure may be located above the source.

Optionally, the flash memory structure may further include a coupling oxide layer between the floating gate structure and the substrate, and the coupling oxide layer may have a thickness greater than a thickness of the oxide layer.

Optionally, the flash memory structure may further include a dielectric layer covering the floating gate structure.

Optionally, in the flash memory structure, the erase gate structure may include a tunneling oxide layer and an erase gate layer formed over the tunneling oxide layer.

According to another aspect of the present invention, a memory array is further provided, including a plurality of memory cells arranged in M rows and N columns, each of the plurality of memory cells being implemented as the flash memory structure as defined above, wherein: the drains of the memory cells in each of the columns are connected by a bit line, and the sources of the memory cells in each of the rows are connected by a source line, the word line structures of the memory cells in each of the rows are connected by a word line, and the erase gate structures of the memory cells in each of the rows are connected by an erase gate line, where M≥1, N≥8, and M and N are both positive integers.

Optionally, in the memory array, in order to perform an erase operation on one of the plurality of memory cells in the memory array, a voltage applied on the erase gate line of the one of the plurality of memory cells is kept between 11.5 V and 12.5V, and voltages applied on the source line, the word line and the bit line of the one of the plurality of memory cells are kept at 0 V.

Optionally, in the memory array, in order to perform a program operation on one of the plurality of memory cells in the memory array, voltages applied on the erase gate line and the source line of the one of the plurality of memory cells are kept between 7 V and 9 V, a voltage applied on the word line of the one of the plurality of memory cells is kept between 1 V and 1.5 V, and a constant current applied on the bit line of the one of the plurality of memory cells is kept between 1 µA and 3 µA.

Optionally, in the memory array, in order to perform a read operation on one of the plurality of memory cells in the memory array, voltages applied on the erase gate line and the source line of the one of the plurality of memory cells are kept at 0 V, a voltage applied on the word line of the one of the plurality of memory cells is kept at 1.5 V or lower, and a voltage applied on the bit line of the one of the plurality of memory cells is kept between 0.6 V and 1 V.

The present invention also provides a method for fabricating a flash memory structure, including: providing a substrate with a source and a drain formed therein; forming a floating gate structure on the substrate, the floating gate structure including two floating gates; forming an erase gate structure on the substrate, the erase gate structure formed between the two floating gates; forming a word line structure on an outer side of each of the two floating gates; and forming an oxide layer between the word line structure and the substrate.

Optionally, the method may include depositing a floating gate layer and a mask layer on the substrate and etching the mask layer and the floating gate layer to form two separate first trenches each stopping within the floating gate layer; removing a portion of each of the mask layer and the floating gate layer between the two first trenches to form a second trench, the second trench penetrating through the floating gate layer; performing a first ion implantation in a portion of the substrate under the second trench to form the source; forming the erase gate structure within the second trench; removing a remainder of the mask layer as well as a portion of the floating gate layer thereunder to expose a portion of the substrate; depositing an oxide layer on a surface of the exposed portion of the substrate and forming the word line structures on the oxide layer; and performing a second ion implantation in the substrate to form the drain.

Optionally, in the method, the oxide layer may have a thickness of from 10 Å to 40 Å.

Optionally, in the method, the thickness of the oxide layer may be 18 Å, 25 Å or 28 Å.

Optionally, the method may further include depositing a coupling oxide layer having a thickness greater than a thickness of the oxide layer, prior to the deposition of the floating gate layer on the substrate.

Optionally, in the method, forming the erase gate structure within the second trench may include: depositing a tunneling oxide layer over the second trench such that the tunneling oxide layer covering bottom and sidewall portions of the second trench; and depositing the erase gate layer over the tunneling oxide layer.

Optionally, the method may further include forming spacers on both sides of the floating gate layer, prior to the formation of the word line structures on the oxide layer.

The present invention provides at least the following benefits over the prior art.

In the proposed flash memory structure, the erase gate structure is formed between the two floating gates, and the word line structure is formed on an outer side of each of the two floating gates, with an oxide layer formed between the word line structure and the substrate. The flash memory structure can be fabricated with a simple process involving fewer masking steps. The memory array employing the flash memory structure is capable of erase operations by means of a voltage applied on the erase gate lines and of read operations by means of a voltage applied on the word lines. This enables read operations at a lower voltage with less power consumed by the memory array. In addition, the memory array is more efficient and more durable.

Further, the oxide layer between the word line structure and the substrate has a thickness of from 10 Å and 40 Å, which allows read operations at a voltage of 1.5 V or lower, significant reduction in power consumption of the memory array, adaptation to low-voltage application and increased operating efficiency and durability of the device.

DETAILED DESCRIPTION

The proposed flash memory structure, memory array and fabrication method will be described in greater detail below with reference to the accompanying flowcharts and schematics, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

In the following paragraphs, the present invention will be described in greater detail by way of example with reference to the accompanying drawings. Features and advantages of the invention will be more apparent from the following detailed description, and from the appended claims. Note that the figures are provided in a very simplified form not necessarily presented to scale, with the only intention of facilitating convenience and clarity in explaining the embodiments.

According to a fundamental aspect of the present invention, a flash memory structure according to the present invention includes:

a substrate having a source and a drain formed therein;

a floating gate structure including two floating gates formed on the substrate;

an erase gate structure formed on the substrate and between the two floating gates;

a word line structure formed on an outer side of each of the two floating gates; and an oxide layer formed between the word line structure and the substrate.

According to another aspect of the present invention, a memory array includes: memory cells arranged in M rows and N columns, wherein: the drains of the memory cells in each of the columns are connected by a bit line, and the sources of the memory cells in each of the rows are connected by a source line, the word line structures of the memory cells in each of the rows are connected by a word line, and the erase gate structures of the memory cells in each of the rows are connected by an erase gate line, and wherein M≥1, N≥8, and M and N are positive integers.

Figure 1:
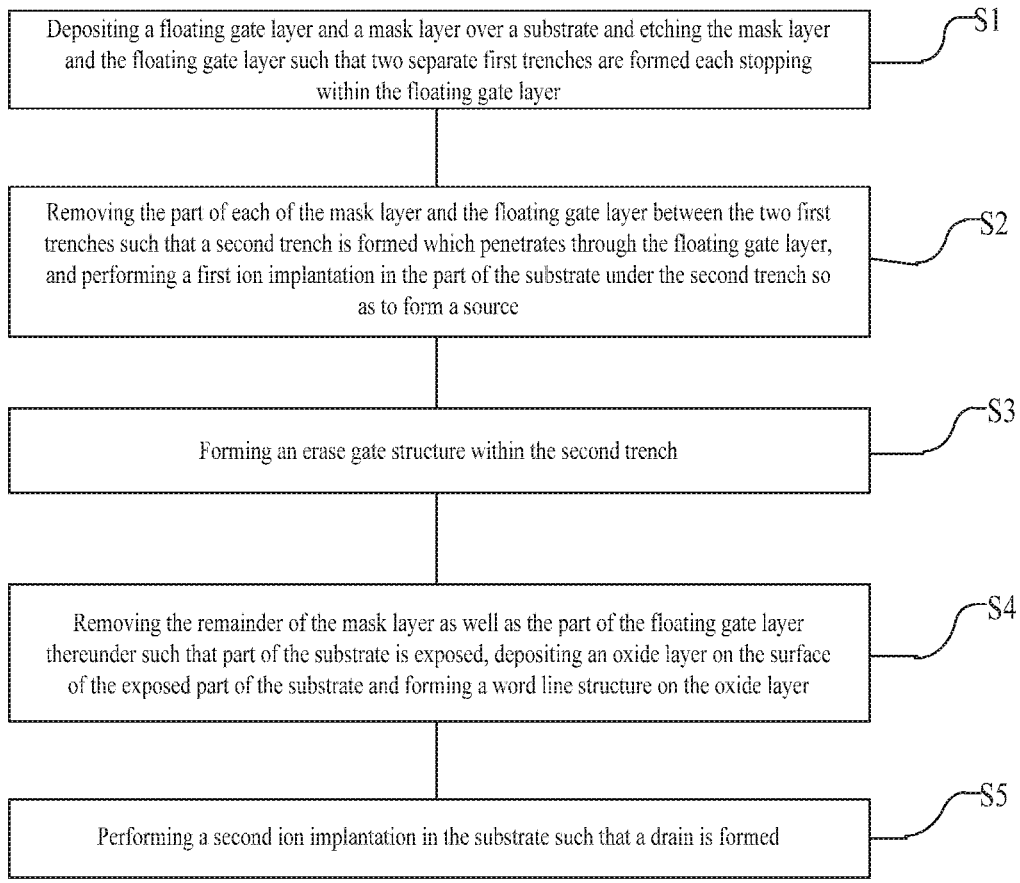
FIG. 1 is a flowchart graphically illustrating a method of fabricating a flash memory structure in accordance with embodiments of the present invention.

The present invention also provides a method of fabricating a flash memory structure, as shown in FIG. 1, including the steps of:

S1) depositing a floating gate layer and a mask layer over a substrate and etching the mask layer and the floating gate layer to form two separate first trenches each stopping within the floating gate layer;

S2) removing a portion of each of the mask layer and the floating gate layer between the two first trenches to form a second trench which penetrates through the floating gate layer, and performing a first ion implantation in a portion of the substrate under the second trench to form a source;

S3) forming an erase gate structure within the second trench;

S4) removing the remainder of the mask layer as well as a portion of the floating gate layer thereunder to expose a portion of the substrate, depositing an oxide layer on the surface of the exposed portion of the substrate and forming word line structures on the oxide layer; and S5) performing a second ion implantation in the substrate to form a drain.

In such a flash memory structure, the erase gate structure is located between the two floating gates, and the word line structures are located over the two floating gates, with an oxide layer interposed between the word line structures and the substrate. The flash memory structure can be fabricated with a simple process involving fewer masking steps. The memory array employing the flash memory structure is capable of erase operations by means of a voltage on the erase gate lines and of read operations by means of a voltage on the word lines. This enables read operations at a lower voltage with less power consumed by the memory array. In addition, the memory array is more efficient and more durable.

Examples of the proposed flash memory structure, memory array and fabrication method will be described below so that the present invention will be more readily understood. It is noted that the present invention is not limited to the examples disclosed hereinafter and that all modifications made by those skilled in the art through conventional technical means are also embraced within the spirit of the invention.

Figure 12:
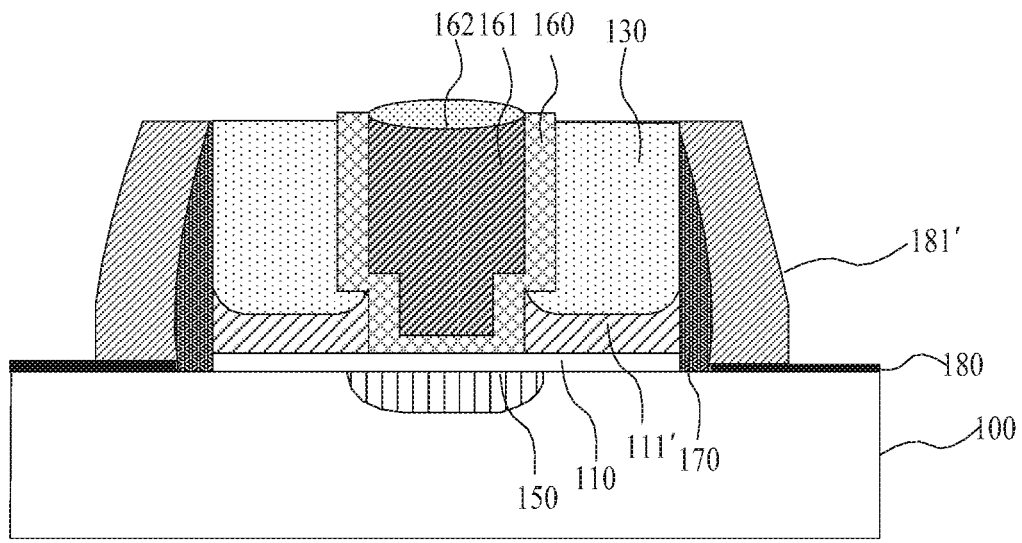
Figure 13:
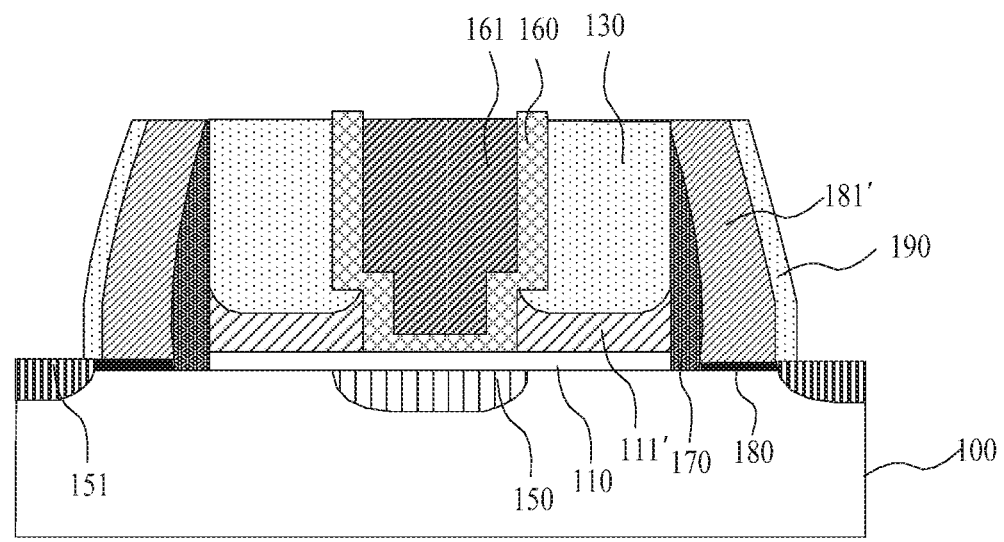
Figures 14, 15:
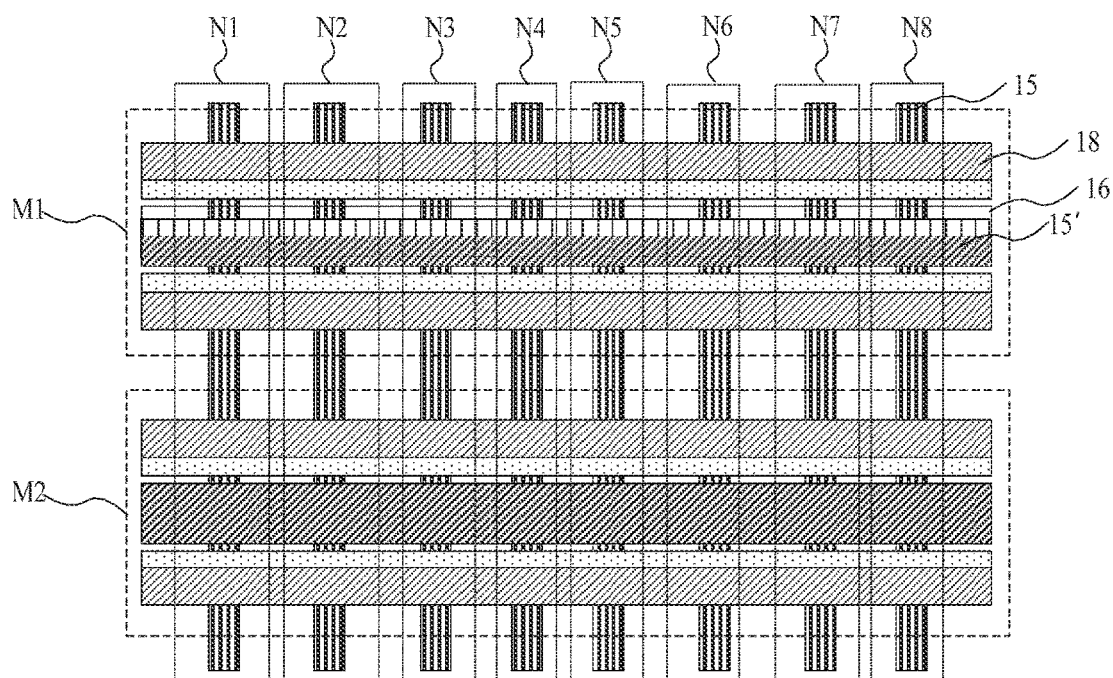
FIG. 14 is a schematic illustration of a memory array according to embodiments of the present invention.
FIG. 15 shows exemplary voltages or currents used in erase, program and read operations of a memory array according to embodiments of the present invention.

FIG. 1 is a flowchart graphically illustrating a method of fabricating a flash memory structure in accordance with embodiments of the present invention. FIGS. 2 to 13 are structural schematics illustrating steps of a method of fabricating a flash memory structure in accordance with embodiments of the present invention. FIG. 14 is a schematic illustration of a memory array according to embodiments of the present invention. FIG. 15 shows exemplary voltages or currents used in erase, program and read operations of a memory array according to embodiments of the present invention.

Figure 2:
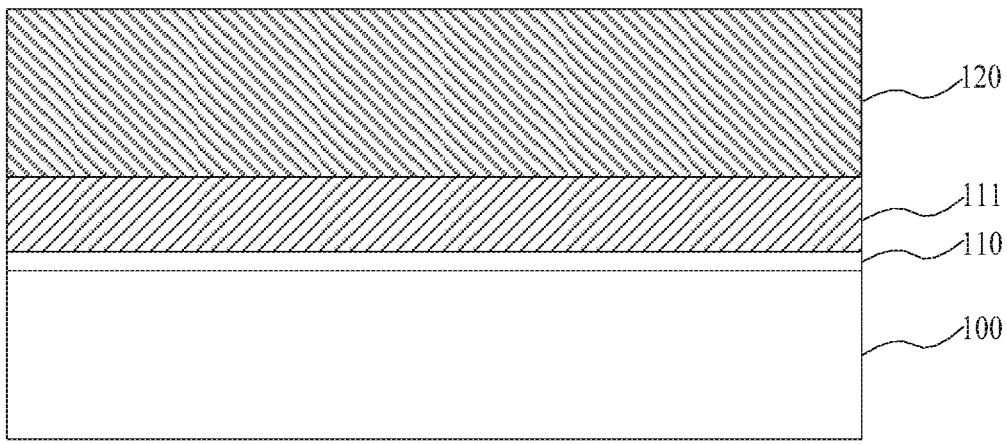
FIGS. 2 to 13 are structural schematics illustrating steps of a method of fabricating a flash memory structure in accordance with embodiments of the present invention.
Figure 3:
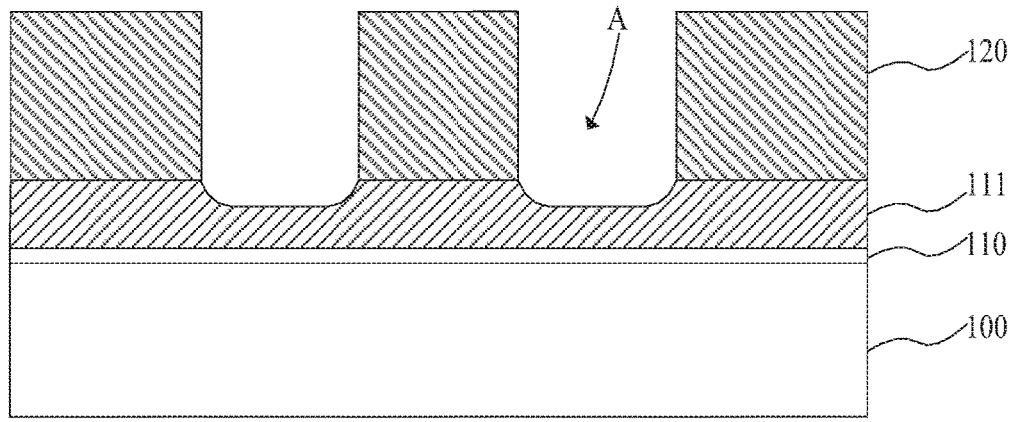
Figure 4:
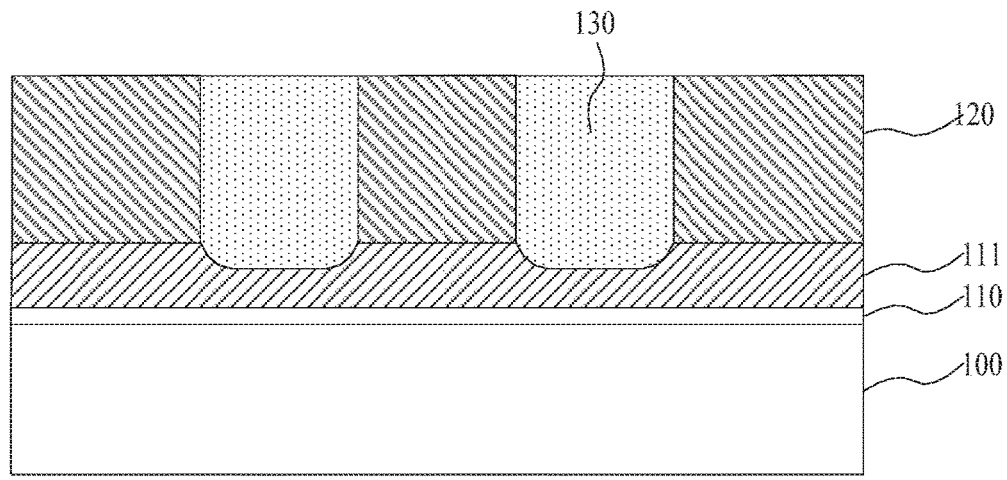
Figure 10:
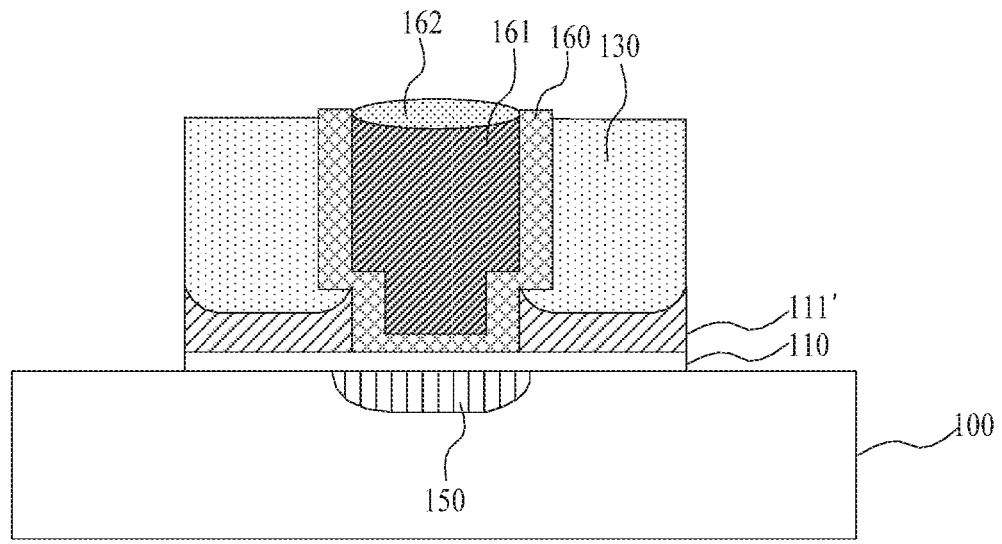

As shown in FIG. 1, step S1 is first carried out to deposit a floating gate layer and a mask layer over a substrate and etch the mask layer and the floating gate layer to form two separate first trenches, the first trenches stopping within the floating gate layer. Preferably, a coupling oxide layer is further provided between the substrate and the floating gate layer. The bottom surface of each first trench within the floating gate layer has a chamfered portion. As shown in FIGS. 2 and 3, first of all, a substrate 100 may be provided, followed by successive deposition of a coupling oxide layer 110, a floating gate layer 111 and a mask layer 120 on top surface of the substrate 100. In specific embodiments, the substrate 100 may include a semiconductor substrate such as a doped silicon substrate, a gallium arsenide substrate, a gallium arsenide phosphide substrate, an indium phosphide substrate, a germanium substrate or a silicon germanium substrate. The coupling oxide layer 110 may be silicon oxide and may have a thickness of about 60 Å. The floating gate layer 111 may be commonly used polycrystalline silicon, and the mask layer 120 may be a silicon nitride layer or a silicon oxynitride layer. In general, prior to the deposition of the mask layer 120, in the substrate 100, a shallow trench isolation structure (not shown) for separating subsequently formed structures may be formed and an active region (not shown) may be defined on which a source and a drain are to be formed. After that, photolithography and etching processes are carried out on the mask layer 120 and on the floating gate layer 111 to form two separate first trenches A. The two first trenches A each stop within the floating gate layer 111, and the bottom surface of each first trench A within the floating gate layer 111 has a chamfered portion (i.e., at the bottom of the first trenches A), in which a floating gate structure is to be formed subsequently (which, as shown in FIG. 10, includes two floating gates 111' with tapered portions). As shown in FIG. 3, the photolithography and etching processes for forming the first trenches A are known to those skilled in the art and will not be described herein for simplicity.

Figure 5:
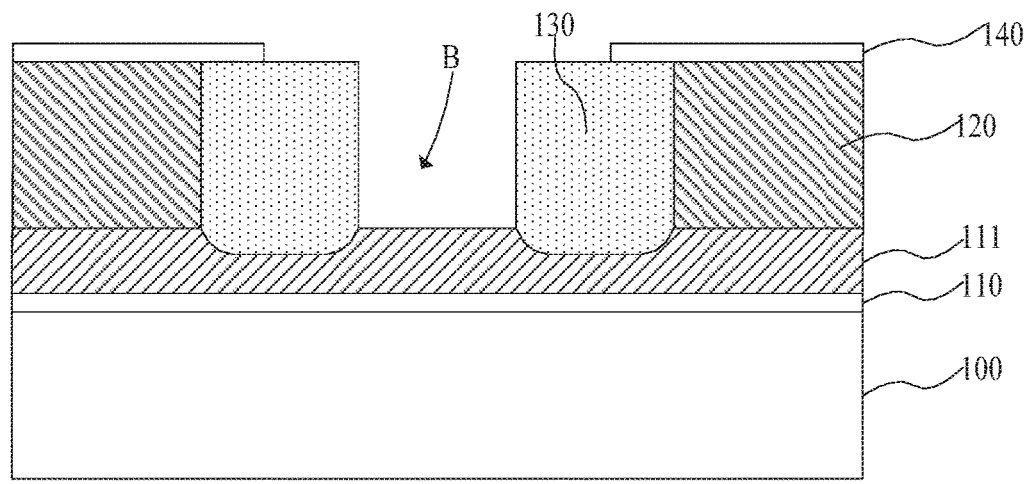
Figure 6:
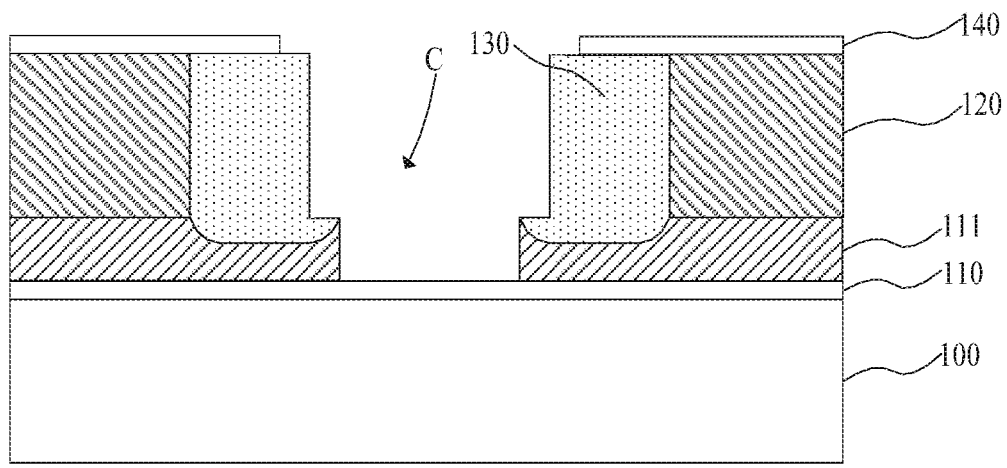
Figure 7:
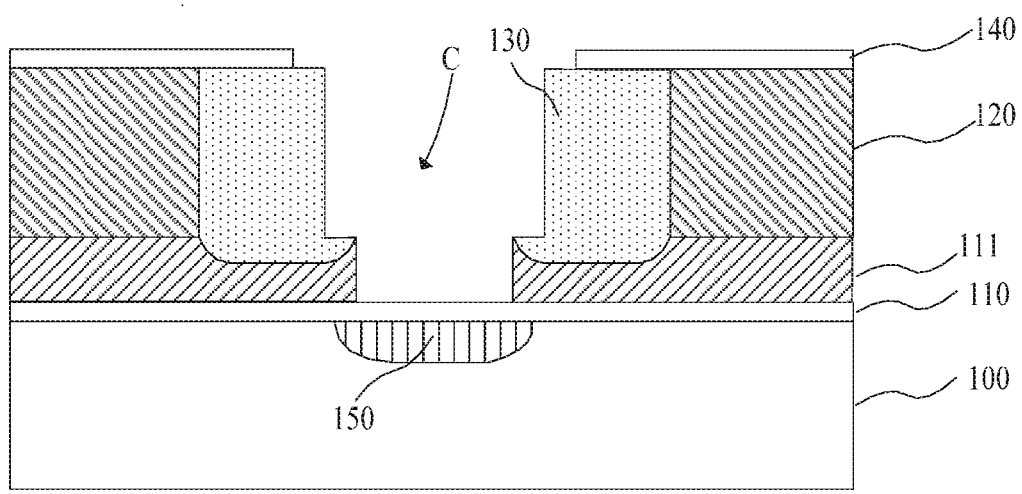

Afterward, step S2 is performed in which the part of each of the mask layer and the floating gate layer between the two first trenches is removed such that a second trench is formed which penetrates through the floating gate layer, and a first ion implantation is performed in the part of the substrate under the second trench so as to form a source. Specifically, as shown in FIGS. 4 to 7, in practice, after the completion of step S1, a dielectric material 130 which can be an oxide is filled into the first trenches A. Subsequently, a protective oxide layer 140 may be further deposited over the surface of the resulting structure, followed by the formation of a first opening in the protective oxide layer 140, so that part of the mask layer 120 between the two first trenches A is exposed via the first opening. The exposed part of the mask layer 120 is then removed to expose the underlying floating gate layer 111, thereby forming the second opening B, as shown in FIG. 5. Then, the exposed part of the floating gate layer 111 is removed to form a second trench C which penetrates through the floating gate layer 111 (it is a matter of course that the dielectric layer 130 may also be partially etched away during the partial removal of the floating gate layer 111), as shown in FIG. 6. Next, as shown in FIG. 7, a first ion implantation is performed in the part of the substrate 100 under the second trench C so that a source 150 is formed.

Figure 8:
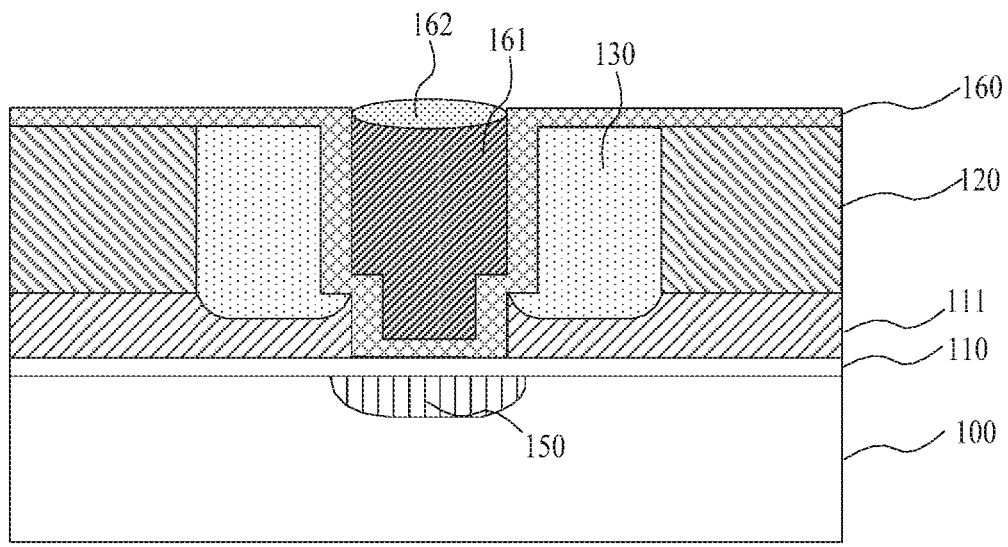

Step S3 is then carried out to form an erase gate structure within the second trench. In particular, in one embodiment, a tunneling oxide layer 160 may be deposited over the second trench C, with the tunneling oxide layer 160 covering bottom and sidewall portions of the second trench C as well as the dielectric layer 130 and the mask layer 120. Subsequently, an erase gate layer 161 for forming the erase gate structure is deposited, which may be commonly used polycrystalline silicon. Finally, the top surface of the erase gate layer 161 may be oxidized to form a protective layer 162 on top of the erase gate layer 161 for subsequently protecting the erase gate layer 161, thereby resulting in the structure as shown in FIG. 8. Apparently, the formation of the erase gate layer 161 may be accomplished using deposition and chemical mechanical planarization (CMP) techniques known to those of ordinary skill in the art, a detailed description thereof is therefore omitted herein.

Figure 9:
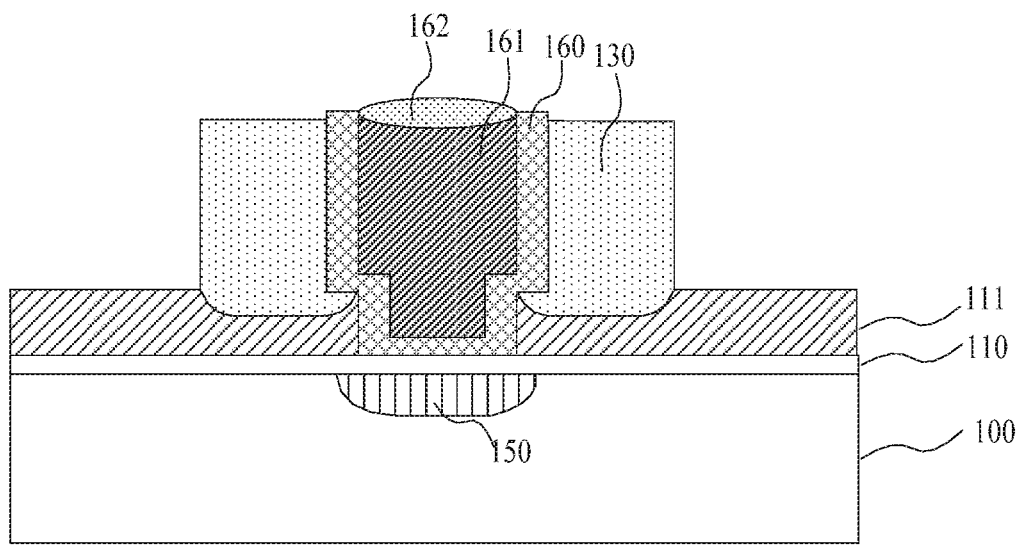
Figure 11:
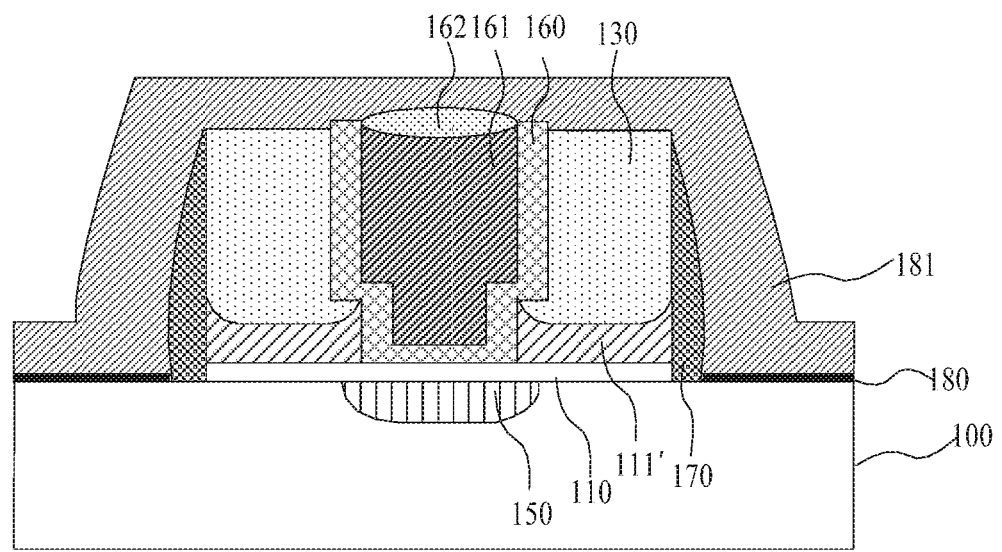

Thereafter, step S4 is performed to remove the remainder of the mask layer as well as the part of the floating gate layer under the remainder of the mask layer such that part of the substrate is exposed, form spacers, deposit an oxide layer on the surface of the exposed part of the substrate and form word line structures on the oxide layer. In one embodiment, the topmost portion of the tunneling oxide layer 160, the remainder of the mask layer 120 and the part of the floating gate layer 111 under the remainder of the mask layer are successively removed to result in the respective structures as shown in FIGS. 9 and 10 (the floating gate structure having the two tapered floating gate 111' is thus formed). Preferably, spacers 170, which may be made of an oxide, are then each formed on an outer side of a corresponding one of the two floating gates 111' in the structure as shown in FIG. 11, followed by deposition of an oxide layer 180 over the exposed part of the surface of the substrate 100. Preferably, the oxide layer 180 may have a thickness comprised between 10 Å and 40 Å. For example, the thickness of the oxide layer 180 may be 18 Å, 25 Å or 28 Å. Following that, word line structures are formed on the oxide layer 180. Specifically, as shown in FIG. 11, a storage layer 181 may be first deposited in the above resulting structure. The storage layer 181 may be commonly used polycrystalline silicon. The storage layer 181 is then etched to form the word line structures 181' as shown in FIG. 12. Since the oxide layer 180 under the word line structures 181' is thinner than the coupling oxide layer 110, its turn-on voltage is lower and allows read operations to be accomplished by a low voltage on the word line structures. For example, read operations are enabled by a voltage of 1.5 V or lower on the word line structures.

At last, in step S5, a second ion implantation is performed in the substrate such that a drain is formed. Specifically, from the structure as shown in FIG. 12, an exposed portion of the oxide layer 180 and the protective layer 162 may be removed. Preferably, a second oxide layer 190 is formed on outer sides of the word line structures 181'. After that, a second ion implantation is carried out in an exposed portion of the substrate 100 to form a drain 151. The resulting flash memory structure is as shown in FIG. 13.

The flash memory structure can be fabricated with a simple process involving fewer masking steps and includes: the substrate 100, in which the source 150 and the drain 151 are formed; the floating gate structure including the two floating gates 111' both above the substrate; the erase gate structure including the tunneling oxide layer 160 on the portion of the substrate in which the source 150 is formed and the erase layer 161 which is formed between the two floating gates 111'; and the word line structures 181' each formed on an outer side of a corresponding one of the two floating gates 111', wherein the word line structures 181' are separated from the substrate 100 by the oxide layer 180. The word line structures 181' are separated from the floating gates 111' by spacers 170. The word line structures 181' and the floating gates 111' are all formed on a portion of the substrate between the source 150 and the drain 151. Obviously, the flash memory structure and its fabrication method further include other processes and features known to those of ordinary skill in the art, for example, electrical connections of the erase gate structure, the word line structures 181', the source 150 and the drain 151, a description of which is omitted herein for simplicity.

The flash memory structure may be used to construct the memory array as shown in FIG. 14. The memory array include memory cells arranged in M rows and N columns, and each of the memory cells is the flash memory structure as defined above, wherein M≥1, N≥8 and M and N are positive integers. The memory cells shown in FIG. 14 are arranged in two rows (M1, M2) and eight columns (N1, N2, N3, N4, N5, N6, N7, N8) as an example. In each column, the drains 151 of the memory cells are connected by a bit line 15. In each row, the sources 150 of the memory cells are connected by a source line 15', the word line structures 181' of the memory cells are connected by a word line 18, and the erase gate structures of the memory cells are connected by an erase gate line 16.

As shown in FIG. 15, in order to perform an erase operation on a certain memory cell (hereinafter referred to as a selected memory cell) in the memory array, a voltage VEG of 11.5 V-12.5 V is applied on the erase gate line 16 to which the selected memory cell is connected, with a voltage VSL on the source line 15', a voltage VWL on the word line 18 and a voltage VBL on the bit line 15 of the selected memory cell each kept at 0V.

In order to perform a program operation on a certain memory cell (hereinafter referred to as a selected memory cell) in the memory array, the voltage VEG on the erase gate line 16 of the selected memory cell and the voltage VSL on the source line 15' of the selected memory cell are both provided to be between 7 V and 9 V, for example, VEG=VSL=8 V; the voltage VWL on the word line 18 of the selected memory cell is between 1 V and 1.5 V, and a current IBL flowing in the bit line 15 of the selected memory cell is a constant current Idp comprised between 1 μA and 3 μA.

In order to perform a read operation on a certain memory cell (hereinafter referred to as a selected memory cell) in the memory array, the voltage VEG on the erase gate line 16 of the selected memory cell and the voltage VSL on the source line 15' of the selected memory cell are both provided to be 0 V; the voltage VWL on the word line 18 of the selected memory cell is lower than 1.5 V, for example, VWL=1V, and the voltage VBL on the bit line 15 of the selected memory cell is between 0.6V and 1 V, for example, VBL=0.8 V.

The memory array is capable of erase operations by means of the voltage on the erase gate lines 16 and of read operations by means of the voltage on the word lines 18. This enables read operations at a lower voltage with less power consumed by the memory array and hence the adaptation to low-voltage applications. In addition, the memory array is more efficient and more durable.

In summary, in the proposed flash memory structure, the erase gate structure is located between the two floating gates, and the word line structures are located over the two floating gates, with an oxide layer interposed between the word line structures and the substrate. The flash memory structure can be fabricated with a simple process involving fewer masking steps. The memory array employing the flash memory structure is capable of erase operations by means of a voltage on the erase gate lines and of read operations by means of a voltage on the word lines. This enables read operations at a lower voltage with less power consumed by the memory array. In addition, the memory array is more efficient and more durable.

Further, the oxide layer between the word line structures and the substrate has a thickness of from 10 Å and 40 Å, which allows read operations at a voltage of 1.5 V or lower, significant reduction in power consumption of the memory array, adaptation to low-voltage application and increased operating efficiency and durability of the device.

It is apparent that those skilled in the art can make various changes and modification without departing from the spirit and scope of the invention. Accordingly, it is intended that the present invention also embraces such changes and modifications if they fall within the scope of the appended claims and the equivalents thereof.

What is claimed is:

1. A method of fabricating a flash memory structure, comprising:
   providing a substrate with a source and a drain formed therein;
   forming a floating gate structure on the substrate, the floating gate structure comprising two floating gates;
   forming an erase gate structure on the substrate, the erase gate structure formed between the two floating gates;
   forming a word line structure on an outer side of each of the two floating gates; and
   forming an oxide layer between the word line structure and the substrate,
   depositing a floating gate layer and a mask layer on the substrate and etching the mask layer and the floating gate layer to form two separate first trenches each stopping within the floating gate layer;
   removing a portion of each of the mask layer and the floating gate layer between the two first trenches to form a second trench, the second trench penetrating through the floating gate layer;
   performing a first ion implantation in a portion of the substrate under the second trench to form the source;
   forming the erase gate structure within the second trench;
   removing a remainder of the mask layer as well as a portion of the floating gate layer thereunder to expose a portion of the substrate, a reminder of the floating gate layer constituting two floating gates;

depositing an oxide layer on a surface of the exposed portion of the substrate and forming the word line structures on the oxide layer; and performing a second ion implantation in the substrate to form the drain.

2. The method according to claim 1, wherein the oxide layer has a thickness of from 10 Å to 40 Å.

3. The method according to claim 2, wherein the thickness of the oxide layer is 18 Å, 25 Å or 28 Å.

4. The method according to claim 1, further comprising depositing a coupling oxide layer having a thickness greater than a thickness of the oxide layer, prior to the deposition of the floating gate layer on the substrate.

5. The method according to claim 1, wherein forming the erase gate structure within the second trench comprises:

depositing a tunneling oxide layer over the second trench, such that the tunneling oxide layer covering bottom and sidewall portions of the second trench; and depositing the erase gate layer over the tunneling oxide layer.

6. The method according to claim 1, further comprising forming a spacer on an outer side of each of the two floating gates, prior to the formation of the word line structures on the oxide layer.

* * * * *